(12) United States Patent
Zhang

(10) Patent No.: US 6,313,696 B1
(45) Date of Patent: Nov. 6, 2001

(54) DIFFERENTIAL BUFFER HAVING COMMON-MODE REJECTION

(75) Inventor: Johnny Q Zhang, San Jose, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/457,269

(22) Filed: Dec. 8, 1999

(51) Int. Cl.⁷ .................................. G06G 7/12; G06G 7/26
(52) U.S. Cl. ............................................................ 327/563
(58) Field of Search ..................................... 327/560–563, 327/52, 55, 530; 330/258, 285, 297

(56) References Cited

U.S. PATENT DOCUMENTS

| | | | |
|---|---|---|---|
| 5,504,443 | * | 4/1996 | Gross et al. ............................ 327/51 |
| 5,936,432 | * | 8/1999 | Oh et al. ............................... 327/55 |
| 6,157,219 | * | 12/2000 | Okada ................................... 327/55 |

* cited by examiner

Primary Examiner—My-Trang Nu Ton

(57) ABSTRACT

Clock circuitry on an integrated circuit chip includes a differential buffer with common-mode rejection circuitry. The differential buffer includes first and second DC paths, each including semiconductor devices connected in cascode circuits. A tap of the first path supplies bias voltage to control electrodes of devices of the first and second paths. Control electrodes of devices in the cascode circuits of the first and second paths are connected to be biased by opposite power supply voltages of the buffer.

17 Claims, 2 Drawing Sheets

DIFFERENTIAL BUFFER HAVING COMMON-MODE REJECTION

TECHNICAL FIELD

The present invention relates generally to differential buffers and more particularly to a differential buffer including first and second DC paths, each including semiconductor devices connected in cascode circuits, wherein a tap of the first path supplies bias voltage to control electrode of devices of the first and second paths and control electrodes of some devices of the second path are connected to be biased by opposite power supply voltages of the buffer.

BACKGROUND ART

Figure 1:
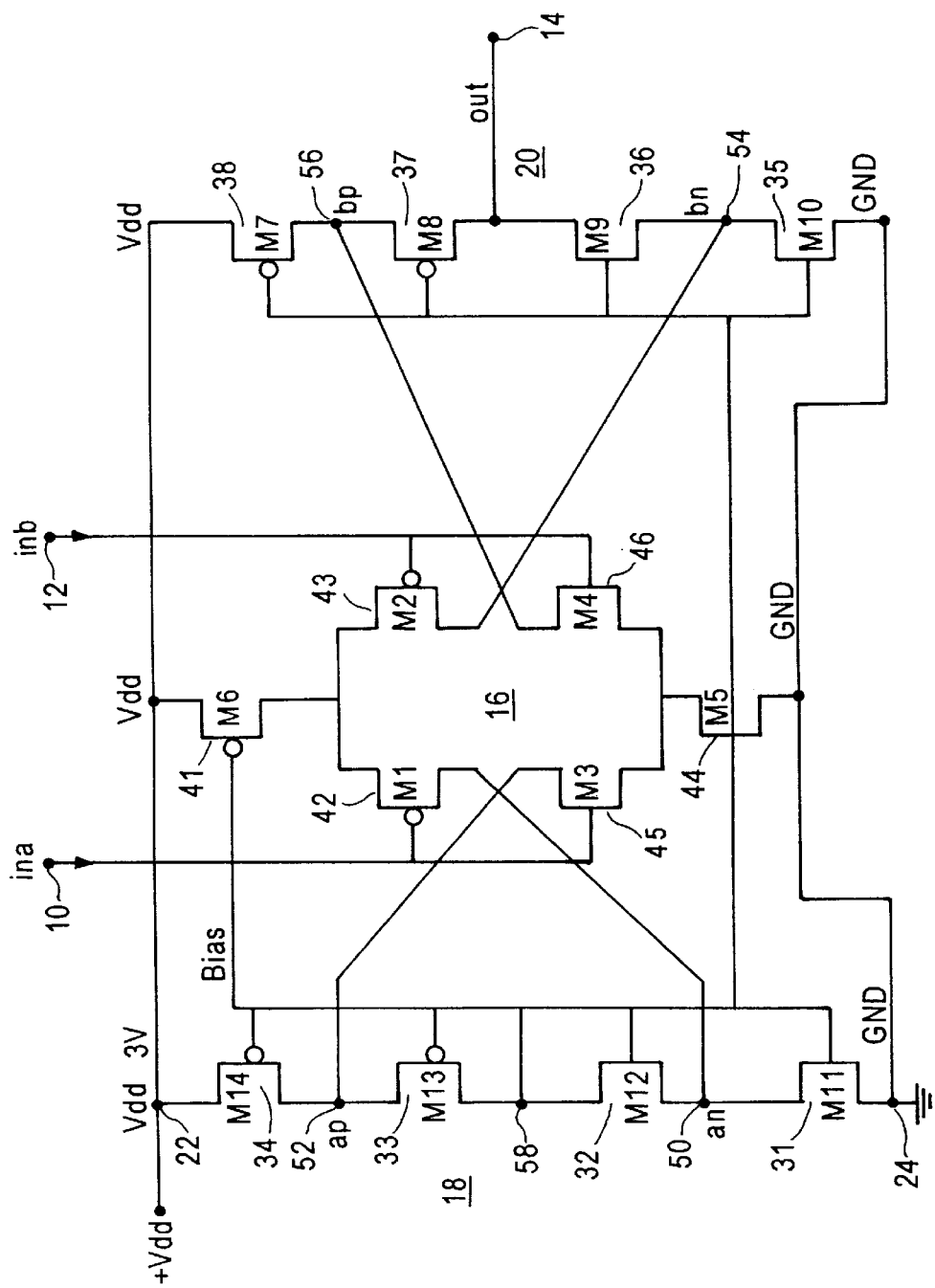

FIG. 1 is a circuit diagram of a prior art differential amplifier or buffer carried by an integrated circuit chip and designed for linear analog amplification purposes. The circuit of FIG. 1 has wide range common-mode rejection properties. The wide range common-mode rejection properties, however, are accompanied by a substantial propagation delay for the common-mode signal differentially applied to terminals 10 and 12, which is coupled to single ended output terminal 14.

The prior art circuit of FIG. 1 includes driver circuit 16 and a pair of output circuits 18 and 20. Each of circuits 16, 18 and 20 includes at least one DC path having several three terminal semiconductor devices connected between positive DC power supply terminal 22 and ground terminal 24. In one typical amplifier, the semiconductor devices included in each of circuits 16, 18 and 20 are metal oxide semiconductor field effect transistors, each having a gate electrode for controlling current flow in a conducting path between source and drain electrodes. Each of output circuits 18 and 20 includes four transistors having stacked series connected source drain paths, such that circuit 18 includes field effect transistors 31–34, while circuit 20 includes field transistors 35–38. N-channel field effect transistors 31 and 35 are connected directly to ground terminal 24 while N-channel field effect transistors 32 and 36 are connected to ground terminal 24 through the source drain paths of transistors 31 and 35, respectively. P-channel field effect transistors 34 and 38 are connected directly to voltage $V_{dd}$ (typically at least 3 volts) at positive DC power supply terminal 22, and P-channel field effect transistors 33 and 37 are respectively connected to terminal 22 via the source drain paths of transistors 34 and 38.

Driver circuit 16 includes P-channel field effect transistor 41, having its source drain path connected to positive DC power supply voltage 22. Transistor 41 is a current source, such that the amount of DC current flowing in its source drain path is controlled by a DC bias voltage applied to the gate of transistor 41. The source drain path of transistor 41 drives the source drain paths of P-channel field effect transistors 42 and 43 in parallel. The source drain path of N-channel field effect transistor 44 (having its gate electrode driven by the same DC bias voltage that is applied to the gate of transistor 41) is a current source connected to ground (i.e., negative) DC power supply terminal 24. The source drain path of transistor 44 drives the source drain paths of N-channel field effect transistors 45 and 46 in parallel.

The gates (i.e., control electrodes) of transistors 42 and 45 are DC connected in parallel to input terminal 10 while the gates of transistors 43 and 46 are DC connected in parallel to input terminal 12. Thereby, as the voltage at terminal 10 increases relative to ground, the voltage between the source and drain of each of transistors 42 and 45 respectively decreases and increases and vice versa for decreasing voltages at terminal 10 relative to ground; similarly, in response to increases in the voltage at terminal 12 relative to ground, the voltages across the source drain paths of transistors 43 and 46 respectively decrease and increase.

The changes in voltages across the source drain paths of transistors 42–46 are DC coupled to paths 18 and 20. To this end, the drain of transistor 42 is connected to terminal 50, between the drain of transistor 31 and the source of transistor 32, while the drain of transistor 45 is connected to terminal 52, between the source of transistor 33 and the drain of transistor 34. As the voltage at terminal 10 increases relative to ground, (1) the gate source voltage of transistor 42 decreases, to decrease the voltage at the drain of transistor 42 relative to ground, whereby the voltage at terminal 50 decreases relative to ground; and (2) the gate source voltage of transistor 45 increases, to decrease the voltage at the drain of transistor 45 relative to ground, whereby the voltage at terminal 52 decreases relative to ground. The decrease in voltage at terminal 50 relative to ground increases the gate source voltage of transistor 50 to reduce the drain voltage of transistor 32, at terminal 58, relative to ground. The decrease in voltage at terminal 52 relative to ground decreases the gate source voltage of transistor 33 to increase the source drain voltage of transistor 33 and decrease the voltage at terminal 58 relative to ground.

Similarly, the output voltage at terminal 14, which is between the drains of transistors 36 and 37, goes down and up in response to the voltage at terminal 12 respectively increasing and decreasing. Common-mode rejection (i.e., cancellation at terminal 14 of like variations in amplitude and polarity of the otherwise differential or complementary variations at terminals 10 and 12) occurs because of variations of the bias voltage at terminal 58 in response to changes in the voltage at input terminal 10.

Since the voltages at terminals 10 and 12 vary in a complementary manner, except for common-mode variations on the voltages applied to these terminals, the voltages at terminals 50 and 52 decrease when the voltages at terminals 54 and 56 increase, and vice versa. Accordingly, in response to the complementary increasing and decreasing voltages at terminals 10 and 12 the bias voltage terminal 58 applies to the gates of transistors 35–38 goes down relative to ground, while the voltages at terminals 54 and 56, at the sources of transistors 36 and 37, go up relative to ground. As a result the gate source voltage of transistor 36 decreases to increase the voltage at the drain of transistor 36 relative to ground while the gate source voltage of transistor 37 increases to increase the voltage at the drain of transistor 37 relative to ground. Since the drains of transistors 36 and 37 are tied to output terminal 14, the voltage at terminal 14 increases relative to ground. Simultaneously, the gate source voltages of transistors 35 and 38 respectively decrease and increase, causing the drain voltages of transistors 35 and 38 to increase relative to ground. The increased voltages at the drains of transistors 35 and 38 relative to ground are coupled through the source drain paths of transistors 36 and 37 to also cause the voltage at output terminal 14 to increase.

The voltages across transistors 35–38 vary in response to the voltages at terminals 10 and 12 such that the voltage at terminal 14 is an inverted replica of the voltage at terminal 12 except for the common variations at terminals 10 and 12 which are canceled in the circuit. The voltages at terminals 10 and 12 are susceptible to changing together in response to external influences being supplied to leads connected between a differential analog source (not shown) and terminals 10 and 12. For example, if the voltages at terminals 10 and 12 both simultaneously go up by the same amount due to common mode variations, the bias voltage at terminal 58 decreases, while the voltages at terminals 54 and 56 decrease. Consequently, the voltages at the drains of transistors 35 and 38 increase relative to ground in response to the bias voltage change, while the voltages at these drains decrease in response to the decreased voltages at the drains of transistors 43 and 46. Whatever change occurs at the drains of transistors 43 and 46 is offset by changes in the voltages across the source drain paths of transistors 36 and 37 in response to the decreased bias voltage terminal 58 applies to the gates of transistors 36 and 37. Similarly, the drain of transistor 43 is connected to terminal 54 between the drain of transistor 35 and the source of transistor 36 while the drain of transistor 46 is connected to terminal 56, common to the source of transistor 37 and the drain of transistor 38. Thereby, the voltages at terminals 54 and 56 decrease relative to ground in response to increases of the voltage at terminal 12 relative to ground.

Bias voltage for all of the transistors of the circuit of FIG. 1 except for transistors 42, 43, 45 and 46 of driver 16, is derived from tap 58. Tap 58 is at an approximate mid-point between the voltages of power supply terminals 22 and 24, at a common terminal in circuit 18 for the drains of transistors 32 and 33. The bias voltage at tap 58 tends to follow changes in the voltage at terminal 10 because the source drain voltages of transistors 32 and 33 change in a complementary manner in response to the changes in voltage at terminal 10.

As mentioned before, the prior circuit of FIG. 1 is usually used for linear analog amplification. One of the reasons why the circuit of FIG. 1 has good common-mode rejection properties is because it does not have an external bias circuit. Instead, bias for all of the transistors, except transistors 42, 43, 45 and 46 which are driven directly by voltages at terminals 10 and 12, is derived from tap 58.

However, if the circuit of FIG. 1 is used as a buffer or amplifier of clock wave pulses on a very large scale integrated circuit chip (e.g., each side having a 2 centimeter length) there is a substantial pulse propagation delay and skew due to circuit variations resulting from semiconductor processing, changes in voltages at terminals 22 and 24 and temperature changes. Skew, which can occur as a function of time and space on the chip, is a phenomenon causing clock pulses to have different propagation delays so they arrive at different times to circuits at different regions on the chip. The voltages at terminals 22 and 24 are subject to variations because of relatively large impedances of leads connected between power supply terminals 22 and 24 and the various components at different locations on the chip directly connected to these terminals. In addition, the voltage at terminal 22 is subject to variations for the usual reasons associated with power supply variations.

One reason why the circuit of FIG. 1 is subject to substantial propagation delay and skew is because of a relatively low gate source voltage of its active load, particularly the active load including transistors 36 and 37. The gate source voltage of transistors 36 and 37 is equal to or less than the source drain voltages of these two transistors; the source drain voltage of transistors 36 and 37 is equal to or less than approximately 0.5 volts, for a typical DC power supply voltage of 3 volts between power supply terminals 22 and 24. The source drain voltages of transistors 36 and 37 are thus considerably smaller than the source drain voltages of transistors 35 and 38 which are directly connected to power supply terminals 24 and 22, respectively.

If terminals 10 and 12 were connected to a pulse source, such as active differential nodes of a clock source formed by a phase lock loop, transistors 32, 33, 36 and 37 would turn off early during a pulse transition time from one level to another. This is because the gate electrodes of transistors 32, 33, 36 and 37 are biased by the voltage at tap 58. The voltage at tap 58 is, in turn, dependent on the conducting states of transistors 42, 43, 45 and 46. Hence, as transistors 42 and 45 turn off and turn on, the conducting states of transistors 32 and 33 are changed and the current flowing to terminal 58 changes accordingly. As a result, there are relatively slow transitions in the voltage at tap 58 in response to changes in the levels of the voltages at terminals 10 and 12. These changes in the voltage at tap 58 result in slow changes at the gates of transistors 36 and 37 and slow changes in the current flowing through the source drain conducting paths of transistors 36 and 37. These factors cause a substantial propagation delay time of voltage transitions at output terminal 14 between the drains of transistors 36 and 37 relative to the transition times of the voltages at terminals 10 and 12.

Another disadvantage of the circuit of FIG. 1, if it were used in response to bi-level clock pulses at terminals 10 and 12, is that the "trip voltage" of the circuit has a tendency to vary. Desirably, the circuit of FIG. 1, if driven by bi-level clock pulses at terminals 10 and 12, changes state when the voltage at terminal 10 increases relative to the voltage at terminal 12 by a value that is one-half of the power supply voltage between terminals 22 and 24. However, because the circuit of FIG. 1 is subject to variations in the power supply voltages at both terminals 22 and 24, variations occur in the voltages at terminal 58, which controls the voltages at which transistors 35–38 switch between on and off states.

It is, accordingly, an object of the present invention to provide a new and improved common-mode differential buffer particularly adapted to respond to bi-level variations, e.g., as are in pulses of clock waves.

Another object of the present invention is to provide a new and improved differential buffer having substantial common-mode rejection, and a short propagation delay time between bi-level transitions at an input terminal of the buffer to the buffer output terminal.

Another object of the invention is to provide a new and improved integrated circuit differential buffer responsive to common-mode signals and having high common-mode rejection, wherein skew due to semiconductor processing, power supply voltage changes and temperature variations is minimized.

An additional object of the present invention is to provide a new and improved integrated circuit differential buffer having high common-mode rejection properties and a relatively constant trip voltage in response to bi-level inputs, despite variations in power supply voltages.

Another object of the present invention is to provide a new and improved integrated circuit differential buffer or amplifier having high common-mode rejection and a pair of output transistors which operate at relatively high speed because they have a relatively high gate-source voltage even though the circuit is self biased, i.e., does not include an external bias source for control electrodes of semiconductor devices in the circuit.

Another object of the present invention is to provide a new and improved integrated circuit low skew differential buffer with a wide range of common-mode noise rejection, wherein the buffer and integrated circuit are particularly adapted to operate with very low DC power supply voltages, such as 1.3 volts.

SUMMARY OF THE INVENTION

In accordance with one aspect of the invention, clock circuitry on an integrated circuit chip comprises a differential buffer with common-mode rejection circuitry. The common-mode rejection circuitry includes first and second DC paths connected across opposite DC power supply terminals. Each of the DC paths includes semiconductor devices connected in cascode circuits. A tap of the first path supplies bias voltage to control electrodes of semiconductor devices of the first and second paths. Control electrodes of some of the semiconductor devices in the cascode circuits of the first and second paths are connected to be biased by voltages adapted to be connected to the opposite power supply terminals.

In accordance with another aspect of the invention, a differential buffer, responsive to a differential common-mode source having first and second complementary output terminals has first and second complementary input terminals responsive to variations at the output terminals and first and second DC paths connected between first and second DC power supply terminals. Each path includes plural semiconductor devices, each having a conducting path connected between the power supply terminals, as well as a control electrode for controlling the conducting path of the device. The devices of the first and second paths are respectively coupled to be responsive to the voltages at the first and second differential input terminals so changes in the voltages at the first and second differential input terminals are reflected in changes in the voltages at first and second taps between pairs of the devices of the first and second paths. Bias connections are provided between the first and second DC power supply terminals and the control electrodes of first and second of the semiconductor devices that are in the first path, and the control electrodes of third and fourth of the semiconductor devices that are in the second path. The conducting paths of the first and third devices are respectively connected between the first tap and the second DC power supply terminal and the second tap and the second DC power supply terminal. The conducting paths of the second and fourth devices are respectively connected between the first tap and the first DC power supply terminal and the second tap and the first DC power supply terminal. A bias connection is provided between the first tap and the control electrodes of fifth and sixth of the semiconductor devices that are included in the second path. The conducting path of the fifth semiconductor device is connected between the second tap and the first power supply terminal. The conducting path of the sixth semiconducting device is connected between the second tap and the second power supply terminal. The buffer is preferably an integrated circuit on an integrated circuit chip.

In a preferred embodiment, there is a bias connection between the first tap and the control electrodes of seventh and eighth of said devices included in the first path. The seventh device is connected between the first tap and the first power supply terminal, while the eighth device is connected between the first tap and the second power supply terminal.

Devices of the first and second paths having a first conductivity type are respectively connected between the first and second taps and first power supply terminal. Devices of the first and second path of a second conductivity type are respectively connected between the first and second taps and the second power supply terminal.

Preferably, each of the paths includes N of said devices, where N is an even integer greater than two.

$$\frac{N}{2}$$

of said devices of the first conductivity type in the first path are connected between the first tap and the first power supply terminal, and $$\frac{N}{2}$$

of said devices of the second conductivity type in the first path are connected between the first tap and the second DC power supply terminal. A similar arrangement is provided in the second path between the second tap and the power supply terminals.

DETAILED DESCRIPTION OF THE DRAWING

Figure 2:
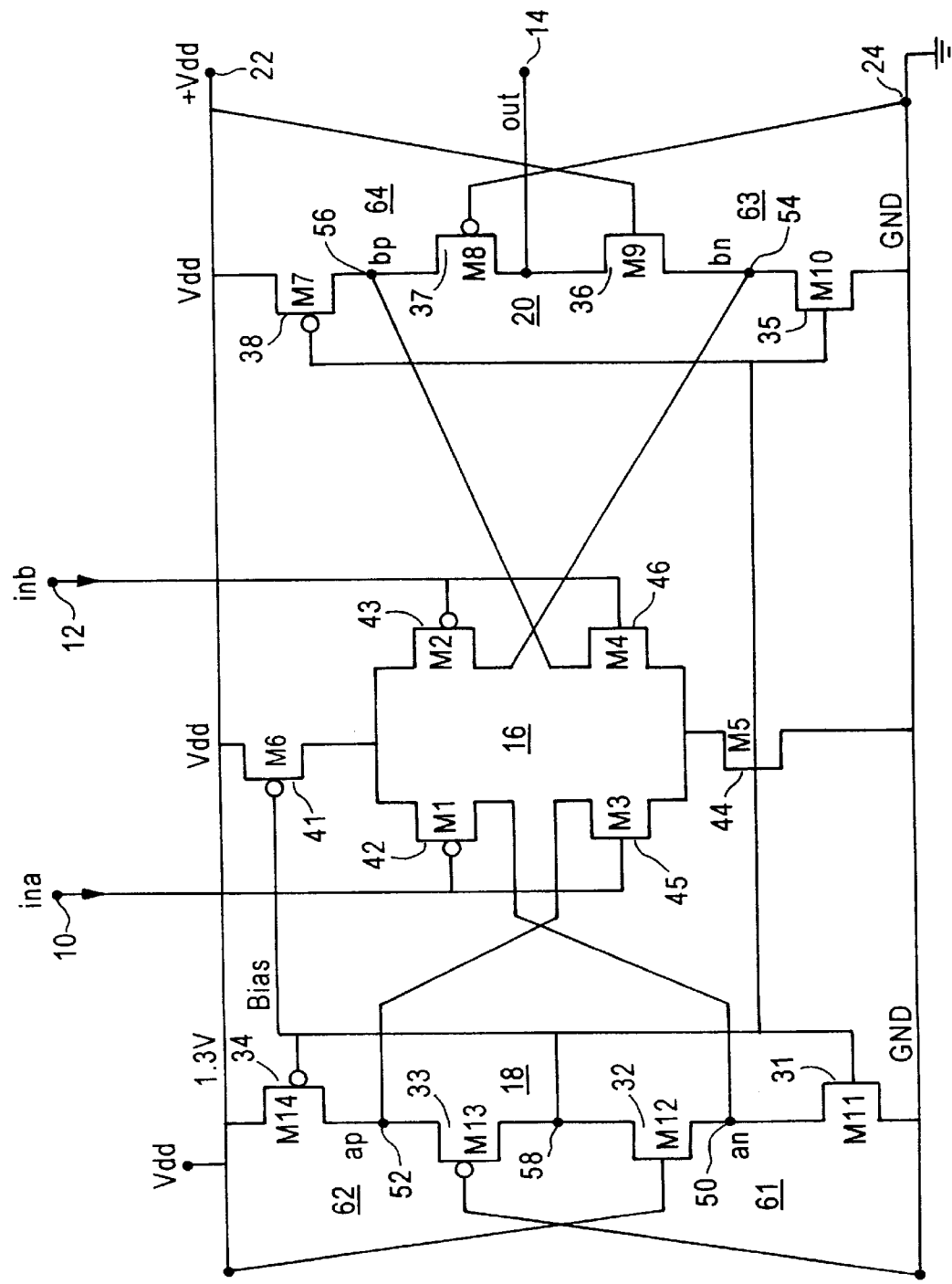

As described above, FIG. 1 is a circuit diagram of a prior art analog differential amplifier with a wide common-mode noise rejection range; and FIG. 2 is a circuit diagram of a differential amplifier for handling pulse type signals in accordance with a preferred embodiment of the present invention for handling pulse type signals.

DESCRIPTION OF THE PREFERRED EMBODIMENT

Reference is now made to FIG. 2 of the drawing, which includes all of the transistors of the circuit of FIG. 1 and is, to a certain extent, configured similarly to the circuit of FIG. 1. Consequently, the same reference numerals are used for the circuit illustrated in FIG. 2 as for the circuit illustrated in FIG. 1.

The circuit of FIG. 2 is particularly adapted to be responsive to a common-mode bi-level source, preferably a clock pulse source which supplies complementary, out-of-phase bi-level voltages to terminals 10 and 12. The circuit of FIG. 2 is one of many circuits on an integrated circuit chip (not shown). Typically the clock source is external to the chip and the illustrated circuit is connected to other circuits on the chip, one of which supplies the clock pulses to the illustrated circuit via wires on the chip. The wires have substantial resistance, e.g., 5 ohms, because they have a very small cross-sectional area.

The circuit of FIG. 2 differs from the circuit of FIG. 1 by the biasing circuits for transistors 32, 33, 36 and 37. The parallel drive for transistors 31–38 from tap 58 in FIG. 1 is replaced in FIG. 2 so that transistors 31 and 32 are connected in a first cascode circuit 61 that is connected in series with a second cascode circuit 62 including transistors 33 and 34; transistors 35 and 36 are connected in a third cascode circuit 63 connected in series with fourth cascode circuit 64 including transistors 37 and 38.

Cascode circuit 61 includes the series connected source drain paths of transistors 31 and 32, such that the gate of transistor 31 is biased by the DC voltage at tap 58 while the gate of transistor 32 is connected to the positive DC power supply voltage at terminal 22. Similarly, cascode circuit 63, including transistors 35 and 36, is such that the gate of transistor 35 is biased by the DC connection between tap 58 and the gate of transistor 35, while the gate of transistor 36 is biased by the DC connection between positive power supply terminal 22 and the gate of transistor 36.

Cascode circuit 62 includes the series combination of transistors 33 and 34, with the bias voltage for the gate of transistor 33 being supplied by the DC connection from power supply terminal 24 to the gate of transistor 33. The gate of transistor 34 is based via the DC connection between tap 58 and the gate of transistor 34. Cascode circuit 64 is such that the gate of transistor 37 is biased by a DC connection to power supply terminal 24 while the DC connection between tap 58 and the gate of transistor 38 applies bias voltage to the gate of transistor 38.

The circuit of FIG. 2 responds to the bi-level complementary signals at terminals 10 and 12 in generally the same manner as the circuit of FIG. 1, except as described infra. In response to the bi-level variations at terminals 10 and 12, the source drain paths of transistors 31–38 and 42, 43, 45, 46 are driven between virtually zero voltage and open circuit conditions. The common-mode variation at terminals 10 and 12 cause the voltages across transistors 35 and 36 to vary in a complementary manner to the voltages across transistors 37 and 38. Thereby, the voltage at output terminal 14 is almost at the ground level of terminal 24 in response to the clock pulse voltage at terminal 12 having a high level and is almost at the positive power supply voltage at terminal 22 in response to the clock pulse voltage at terminal 12 having a low level.

In the pulse responsive circuit of FIG. 2, the DC power supply voltage at terminal 22 is 1.3 volts in contrast to the 3 volt power supply voltage of the prior art analog circuit of FIG. 1. Despite the relatively low 1.3 volt level of the power supply voltage, the delay imposed by the circuit of FIG. 2 on the voltages in propagating between input terminals 10 and 12 and output terminal 14 is substantially less (approximately 30 percent) than the propagation delay of the circuit of FIG. 1.

One of the primary reasons for this decreased propagation delay is the fixed, increased current supplied to each of the gates of transistors 32, 33, 36 and 37 by the relatively fixed power supply voltages at terminals 22 and 24. The gate voltages of transistors 32, 33, 36 and 37 remain constant at the voltages of power supply terminals 22 and 24 during switching so that these transistors remain on most or all of the time during switching. Because the voltages applied to the gates of transistors 32, 33, 36 and 37 remain relatively constant, at the voltages of power supply terminals 22 and 24, the tendency for the operating characteristics of transistors 32, 33, 36 and 37 to change as a function of semiconductor processing, power supply voltage and temperature variations is much less than with the prior art circuit of FIG. 1. The circuit of FIG. 2 retains the wide range of common-mode noise rejection that is provided by the circuit of FIG. 1 because transistors 31, 34, 35, 38, 41 and 44 are internally biased by the DC voltage at tap 58.

Each of cascode circuits 61–64 includes negative feedback to compensate for variations in the voltages at power supply terminals 22 and 24. If, for example, the voltage at power supply terminal 22 increases, the voltage at tap 58 has a tendency to increase as a result of the increased voltage drops across transistors 33 and 34. However, the increase in voltage at power supply terminal 22 biases the gate of transistor 32 more positively, causing a lower impedance to be coupled from ground through transistors 31 and 32 to terminal 58. Thereby, tap 58 remains at a relatively constant voltage. Consequently, the bias voltages applied by tap 58 to transistors 31, 34, 35 and 38, as well as transistors 41 and 44, remain relatively constant.

Transistors 31–38, in the circuit of FIG. 2, can be considered as being connected as a two-fold cascode differential buffer. Transistors 33, 34, 37 and 38 of cascode circuits 62 and 64 can be considered as a first differential amplifier with a common-mode range between the voltage at power supply voltage terminal 22 and a mid-range voltage between the voltages of power supply terminals 22 and 24. Similarly, cascode stages 61 and 63, including transistors 31, 32, 35 and 36, can be considered as a second differential amplifier with a common-mode range between ground and a mid-range voltage between power supply terminals 22 and 24. The two folded cascode differential buffers are combined in the circuit of FIG. 2 to provide a rail-to-rail common-mode range, i.e., the common-mode variations of the voltages applied to terminals 10 and 12 can vary from ground up to the 1.3 volt positive DC power supply voltage ($V_{dd}$) at terminal 22. The rail-to-rail common-mode range can be achieved because of the internal, self-biasing voltage established at tap 58 for transistors 31, 34, 35, 38, as well as transistors 41 and 44.

While there have been described and illustrated specific embodiments of the invention, it will be clear that variations in the details of the embodiments specifically illustrated and described may be made without departing from the true spirit and scope of the invention as defined in the appended claims.

I claim:

1. Clock circuitry on an integrated circuit chip comprising a differential buffer with common-mode rejection circuitry, the common-mode rejection circuitry including first and second DC paths connected across opposite DC power supply terminals, each of the DC paths including semiconductor devices connected in cascode circuits, a tap of the first path being arranged for supplying bias voltage to control electrodes of semiconductor devices of the first and second paths, control electrodes of some of the semiconductor devices in the cascode circuits of the first and second paths being connected to be biased by voltages adapted to be connected to the opposite power supply terminals.

2. A differential buffer responsive to a differential common-mode source having first and second complementary output terminals comprising first and second complementary input terminals respectively adapted to be responsive to variations at the complementary output terminals, first and second DC paths connected between first and second DC power supply terminals, each path including plural semiconductor devices, each semiconductor device having a conducting path connected between the power supply terminals and a control electrode for controlling the conducting path of the device, devices of the first path being coupled to be responsive to the voltage at the first complementary input terminal so changes in the voltage at the first complementary input terminal are reflected in changes in the voltage at a first tap between a pair of the devices of the first path, devices of the second path being coupled to be responsive to the voltage at the second complementary input terminal so that changes in the voltage at the second complementary input terminal are reflected in changes in the voltage at a second tap between a pair of the devices of the second path, first and second bias connections respectively provided between the first and second DC power supply terminals and the control electrodes of first and second of said devices of the first path, third and fourth bias connections respectively provided between the first and second DC power supply terminals and the control electrodes of third and fourth of said devices of the second path, the conducting paths of the first and third devices being respectively connected between the first tap and the second DC power supply terminal and the second tap and the second DC power supply terminal, the conducting paths of the second and fourth devices being respectively connected between the first tap and the first DC power supply terminal and the second tap and the second DC power supply terminal, a fifth bias connection between the first tap and electrodes of fifth and sixth of said devices included in the second path so that the voltage across the fifth and sixth devices is responsive to changes in voltage at the first tap, the conducting path of the fifth device being connected between the second tap and the first power supply terminal, the conducting path of the sixth device being connected between the second tap and the second power supply terminal.

3. The buffer of claim 2 further including a bias connection between the first tap and the control electrodes of seventh and eighth of said devices included in the first path, the seventh device being connected between the first tap and the first power supply terminal, the eighth device being connected between the first tap and the second power supply terminal.

4. The buffer of claim 3 wherein the first and second paths include the same number of said devices, all the devices of the first path connected between the first tap and first power supply terminal and all the devices of the second path connected between the second tap and first power supply terminal being of a first conductivity type, all the devices of the first path connected between the first tap and the second power supply terminal and all the devices of the second path connected between the second tap and the second power supply terminal being of a second conductivity type.

5. The buffer of claim 4 wherein each of the paths includes N of said devices, where N is an even integer greater than 2, $$\frac{N}{2}$$

of said devices of the first conductivity type in the first path being connected between the first tap and the first power supply terminal, $$\frac{N}{2}$$

of said devices of the second conductivity type in the first path being connected between the first tap and the second DC power supply terminal, $$\frac{N}{2}$$

of said devices of the first conductivity type in the second path being connected between the second tap and the first power supply terminal, $$\frac{N}{2}$$

of said devices of the second conductivity type in the second path being connected between the second tap and the second DC power supply terminal.

6. The buffer of claim 5 further including driver circuitry for coupling the common-mode signal at the first and second complementary input terminals to the first and second paths, the driver circuitry including (a) a first pair of said devices, each having a control electrode connected to the first complementary input terminal, and (b) a second pair of said devices, each having a control electrode connected to the second complementary input terminal, connections between the first pair of devices of the driver circuitry and the devices of the first path being arranged for controlling current flow through the conducting paths of the devices of the first path in response to the voltage at the first complementary input terminal, connections between the second pair of devices of the driver circuitry and the devices of the second path being arrange for controlling current flow through the conducting paths of the devices of the second path in response to the voltage at the second complementary input terminal.

7. The buffer of claim 6 wherein the driver circuitry includes another of said devices connected to supply current to the conducting paths of the devices of the first and second pairs, and further including a biasing connection between the first tap and the control electrode of the device connected to supply current to the conducting paths of the devices of the first and second pairs.

8. The buffer of claim 2 wherein the first and second paths include the same number of said devices, all the devices of the first path connected between the first tap and first power supply terminal and all the devices of the second path connected between the second tap and first power supply terminal being of a first conductivity type, all the devices of the first path connected between the first tap and the second power supply terminal and all the devices of the second path connected between the second tap and the second power supply terminal being of a second conductivity type.

9. The buffer of claim 8 wherein each of the paths includes N of said devices, where N is an even integer greater than 2, $$\frac{N}{2}$$

of said devices of the first conductivity type in the first path being connected between the first tap and the first power supply terminal, $$\frac{N}{2}$$

of said devices of the second conductivity type in the first path being connected between the first tap and the second DC power supply terminal, $$\frac{N}{2}$$

of said devices of the first conductivity type in the second path being connected between the second tap and the first power supply terminal, $$\frac{N}{2}$$

of said devices of the second conductivity type in the second path being connected between the second tap and the second DC power supply terminal.

10. The buffer of claim 9 further including driver circuitry for coupling the common-mode signal at the first and second complementary terminals to the first and second paths, the driver circuitry including (a) a first path of said devices, each having a control electrode connected to the first complementary input terminal, and (b) a second pair of said devices, each having a control electrode connected to the second complementary input terminal, connections between the first pair of devices of the driver circuitry and the devices of the first pair being arranged for controlling current flow through the conducting paths of the devices of the first path in response to the voltage at the first complementary input terminal, connections between the second pair of devices of the driver circuitry and the devices of the second path being arranged for controlling current flow through the conducting paths of the devices of the second path in response to the voltage at the second complementary input terminal.

11. The buffer of claim 10 wherein the driver circuitry includes another of said devices connected to supply current to the conducting paths of the devices of the first and second pairs, and further including a biasing connection between the first tap and the control electrode of the device connected to supply current to the conducting paths of the devices of the first and second pairs.

12. The buffer of claim 2 wherein each of the paths includes N of said devices, where N is an even integer greater than 2, $$\frac{N}{2}$$

of said devices of the first conductivity type in the first path being connected between the first tap and the first power supply terminal, $$\frac{N}{2}$$

of said devices of the second conductivity type in the first path being connected between the first tap and the second DC power supply terminal, $$\frac{N}{2}$$

of said devices of the first conductivity type in the second path being connected between the second tap and the first power supply terminal, $$\frac{N}{2}$$

of said devices of the second conductivity type in the second path being connected between the second tap and the second DC power supply terminal.

13. The buffer of claim 12 further including driver circuitry for coupling the common-mode signal at the first and second differential terminals to the first and second paths, the driver circuitry including (a) a first path of said devices, each having a control electrode connected to the first complementary input terminal, and (b) a second pair of said devices, each having a control electrode connected to the second complementary input terminal, connections between the first pair of devices of the driver circuitry and the devices of the first pair being arranged for controlling current flow through the conducting paths of the devices of the first path in response to the voltage at the first complementary input terminal, connections between the second pair of devices of the driver circuitry and the devices of the second path being arranged for controlling current flow through the conducting paths of the devices of the second path in response to the voltage at the second complementary input terminal.

14. The buffer of claim 13 wherein the driver circuitry includes another of said devices connected to supply current to the conducting paths of the devices of the first and second pairs, and further including a biasing connection between the first tap and the control electrode of the device connected to supply current to the conducting paths of the devices of the first and second pairs.

15. The buffer of claim 2 further including driver circuitry connected for coupling variations responsive to variations at the first and second complementary input terminals to the first and second paths, the driver circuitry including a first pair of said devices, each having a control electrode connected to the first differential terminal and a second pair of said devices, each having a control electrode connected to the second differential input terminal, connections between the first pair of devices of the driver circuitry and the devices of the first path controlling current flow through the conducting paths of the devices of the first path in response to the voltage at the first complementary input terminal, connections between the second pair of devices of the driver circuitry and the devices of the second path controlling current flow through the conducting paths of the devices of the second path in response to the voltage at the second complementary input terminal.

16. The buffer of claim 15 wherein the driver circuitry includes another of said devices connected to supply current to the conducting paths of the devices of the first and second pairs, and further including a biasing connection between the first tap and the control electrode of the device connected to supply current to the conducting paths of the devices of the first and second pairs.

17. A differential buffer adapted to be connected to be responsive to a differential common-mode clock, the differential buffer being on an integrated circuit chip, the buffer comprising first and second complementary input terminals for receiving complementary phases of the differential common-mode clock, first and second DC paths between first and second DC power supply terminals, each path including plural semiconductor devices, each semiconductor device having a conducting path connected between the power supply terminals and a control electrode for controlling the conducting path of the device, devices of the first path being coupled to be responsive to the voltage at the first complementary input terminal so that changes in the voltage at the first complementary input terminal are reflected in changes in the voltage at a first tap between a pair of the devices of the first path, the devices of the second path being coupled to be responsive to the voltage at the second complementary input terminal so that changes in the voltage at the second complementary terminal are reflected in changes in the voltage at a second tap between a pair of devices of the second path, the conducting paths and control electrodes of the devices of the first path being connected to each other and biased to form a first pair of series connected cascode circuits, the conducting paths and control electrodes of the devices of the second path being connected to each other and biased to form a second pair of series connected cascode circuits, a bias connection between the first tap and electrodes of the devices of the first and second paths so that voltages across devices of the first and second paths are controlled in response to the voltage at the first tap.

* * * * *